(12) United States Patent
Tsai

(10) Patent No.: US 11,515,310 B2
(45) Date of Patent: Nov. 29, 2022

(54) CELL ARRAY AND METHOD FOR FABRICATING THE SAME

(71) Applicant: NANYA TECHNOLOGY CORPORATION, New Taipei (TW)

(72) Inventor: Tsung-Yu Tsai, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/210,482

(22) Filed: Mar. 23, 2021

(65) Prior Publication Data

US 2022/0310609 A1 Sep. 29, 2022

(51) Int. Cl.
*H01L 27/108* (2006.01)
*H01L 21/762* (2006.01)
*H01L 29/06* (2006.01)

(52) U.S. Cl.
CPC ...... *H01L 27/10805* (2013.01); *H01L 21/762* (2013.01); *H01L 27/1085* (2013.01); *H01L 29/0653* (2013.01)

(58) Field of Classification Search
None
See application file for complete search history.

(56) References Cited

U.S. PATENT DOCUMENTS 10,062,613 B1 * 8/2018 Chang ............... H01L 27/10891
2014/0239377 A1 * 8/2014 Nishida ............. H01L 27/11573
438/591

OTHER PUBLICATIONS

Satendra Kumar Gautam et al., "Improvement of Row Hammering Using Metal Nanoparticles in DRAM—A Simulation Study," in IEEE Electron Device Letters, vol. 39, No. 9, pp. 1286-1289, Sep. 2018.
S.K. Gautam et al., "Row Hammering Mitigation Using Metal Nanowire in Saddle Fin DRAM," in IEEE Transactions on Electron Devices, vol. 66, No. 10, pp. 4170-4175, Oct. 2019.

* cited by examiner

*Primary Examiner* — Anthony Ho
*Assistant Examiner* — Kevin Quinto
(74) *Attorney, Agent, or Firm* — CKC & Partners Co., LLC

(57) ABSTRACT

A cell array includes a substrate and a conductive line. The substrate has active areas in the substrate. The conductive line is disposed across the active areas and includes work function nodes and line sections which are horizontally and alternately arranged with work function nodes, in which each work function node is between two of the active areas.

19 Claims, 7 Drawing Sheets

CELL ARRAY AND METHOD FOR FABRICATING THE SAME

BACKGROUND

Field of Invention

The present invention relates to a cell array. More particularly, the present invention relates to a cell array applied in Dynamic Random Access Memory (DRAM).

Description of Related Art

Regarding classical Buried-Channel Array Transistor (BCAT) devices, row hammer effect can't be avoided. Row hammer effect is caused by a charge pumping process which is consisting of charge capture and emission under or around an aggressor word line and subsequent carrier migration to a victim storage node.

Through repeatedly turning on and off the word line, the near storage node voltage will be negatively influenced, and thus storage data would be changed by time.

SUMMARY

The invention provides a cell array which includes a substrate and a conductive line. The substrate has active areas therein. The conductive line is disposed across the active areas and includes work function nodes and line sections which are horizontally and alternately arranged with work function nodes, in which each work function node is between two of the active areas.

In some embodiments of the present disclosure, each work function node has a vertical length greater than a vertical length of each line section.

In some embodiments of the present disclosure, each work function node has a work function value greater than a work function value of each line section.

In some embodiments of the present disclosure, each work function node is between immediately adjacent two of the line sections.

In some embodiments of the present disclosure, the work function nodes are cone-shaped.

In some embodiments of the present disclosure, the conductive line has cup-shaped protective films respectively surround the work function nodes.

In some embodiments of the present disclosure, the protective films include silicon oxynitride.

In some embodiments of the present disclosure, the cell array further includes first STI structures and second STI structures which define the active areas, wherein each work function node is partially in one of the second STI structures.

In some embodiments of the present disclosure, the first STI structures are alternately arranged with the second STI structures, each second STI structure has a width greater than a width of each first STI structure.

In some embodiments of the present disclosure, the cell array further includes an insulation layer formed over the substrate and the conductive line.

Another aspect of the present disclosure is related to a method for forming a cell array. The method includes providing a substrate which has a doped area therein; forming first STI structures and second STI structures in the doped area, such that active areas are formed among the first STI structures and the second STI structures; and forming a conductive line across the active areas, the first STI structures, and the second STI structures, in which the conductive line includes work function nodes and line sections which are horizontally and alternately arranged with work function nodes, the work function nodes are respectively disposed in the second STI structures, and each work function node is between two of the active areas.

In some embodiments of the present disclosure, each second STI structure has a width greater than a width of each first STI structure.

In some embodiments of the present disclosure, forming the first STI structures and the second STI structures in the active area includes forming first trenches in the substrate; etching twos of the first trenches to form second trenches; and filling the first trenches and the second trenches with dielectric material to form the first STI structures and the second STI structures.

In some embodiments of the present disclosure, forming the conductive line includes forming third trenches respectively in the second STI structures; forming work function nodes in the third trenches, respectively; and forming the line sections, in which each line section is connected between two of the work function nodes.

In some embodiments of the present disclosure, forming the conductive line includes: forming third trenches respectively in the second STI structures; comformally forming cup-shaped protective films in the third trenches, respectively; forming work function nodes in the protective firms, respectively; and forming the line sections, in which each line section is between two of the work function nodes.

In some embodiments of the present disclosure, forming the conductive line includes: selectively and partially remove the first STI structures, the second STI structures, and the substrate, such that forth trenches respectively between twos of the work function node are formed; and filling the forth trenches with conductive material to form the line sections.

In some embodiments of the present disclosure, the method further includes forming an insulation layer on the substrate and the conductive line.

In some embodiments of the present disclosure, the work function nodes are cone-shaped.

Embodiments of the present disclosure provide a cell array and a method for fabricating the same, in which the work function nodes of the cell array can efficiently curb row hammer effect among active areas thereof. Therefore, the data bit failure of a memory device with the provided cell array can be decreased and prevented.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
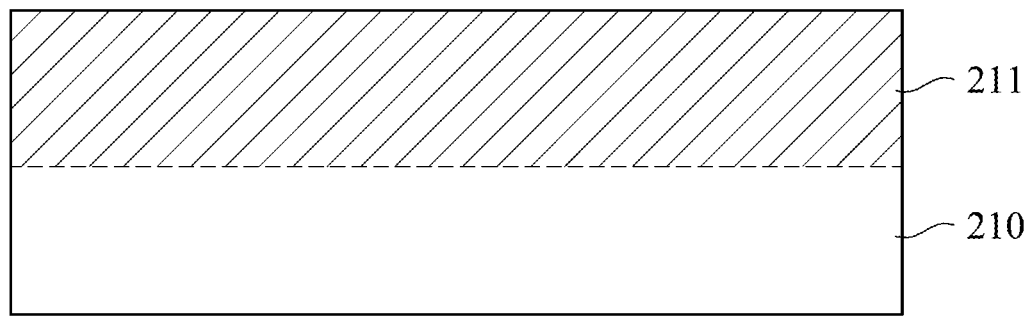
FIGS. 1-9 are cross-sectional views of intermediate stages of a method for fabricating a cell array in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method for forming a cell array. The method includes providing a substrate which has a doped area therein; forming first shallow trench isolation (hereinafter abbreviated as STI) structures and the second STI structures in the doped area, such that active areas are formed among the first STI structures and the second STI structures; and forming a conductive line across the active areas, the first STI structures, as well as the second STI structures, in which the conductive line includes work function nodes and line sections which are horizontally and alternately arranged with work function nodes, the work function nodes are respectively disposed in the second STI structures, and each work function node is between immediately-adjacent two of the active areas.

Reference is made to FIG. 1. FIG. 1 can represent providing a substrate 210 which has a doped area 211 therein. The substrate 210 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof. Each doped area 211 can include an n-type well, a p-type well, and a p-n junction between the n-type well and the p-type well. The p-type well is doped with p-type dopants such as boron, and the n-type well is doped with n-type dopants such as arsenic or phosphorous. The present disclosure is not limited in this respect.

Figure 2:
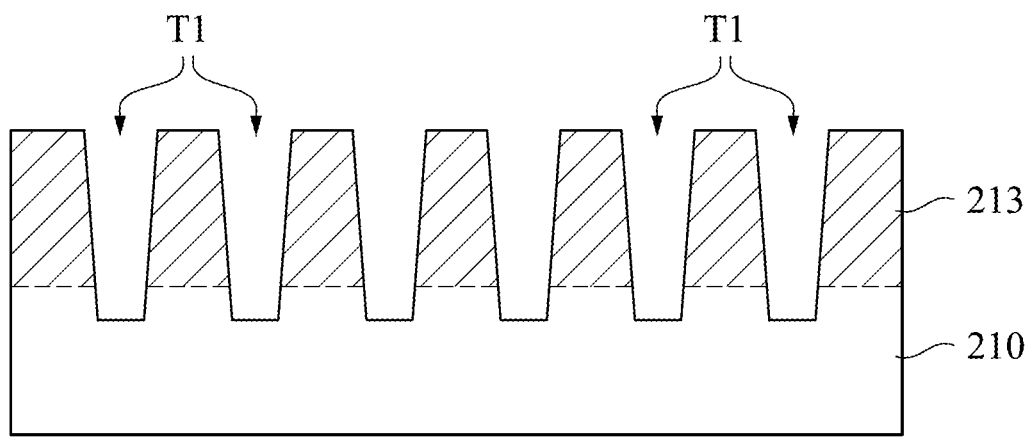
Figure 3:
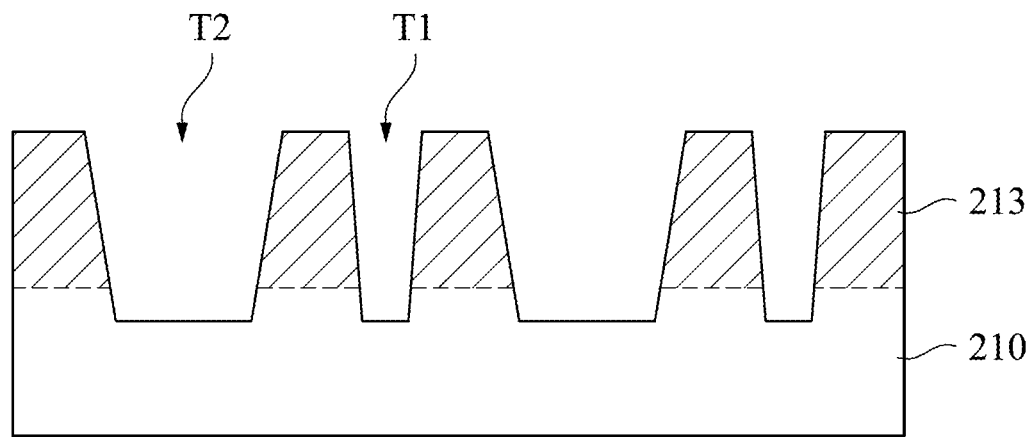
Figure 4:
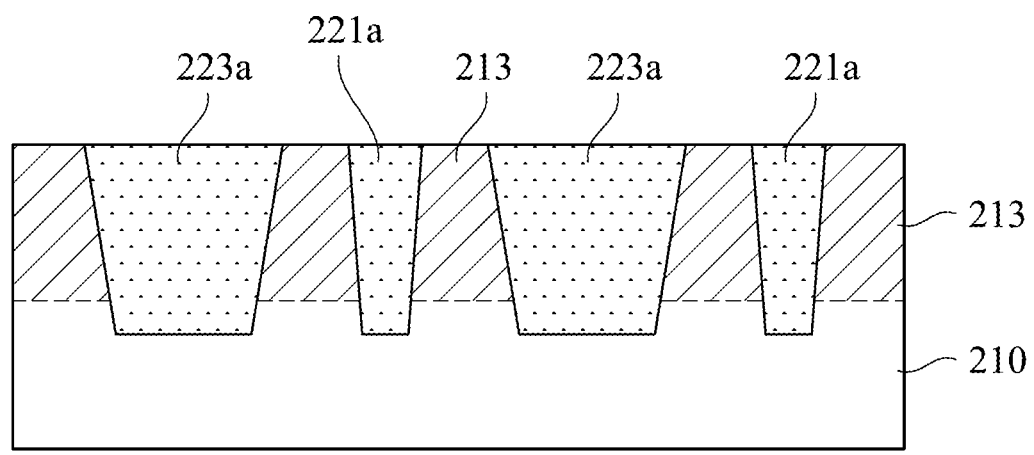

Reference is made to FIGS. 2-4. FIGS. 2-4 can represent forming first STI structures 221a and the second STI structures 223a in the doped area 211 (shown in FIG. 1), such that active areas 213 are formed among the first STI structures 221a and the second STI structures 223a. In FIG. 2, an anisotropic etching process is performed to the substrate 210, such that the first trenches T1 in the substrate 210. The anisotropic etching process can include a reactive ion etching process or a plasma etching process. The anisotropic process can be performed with a patterned photoresist layer (not shown) formed over the substrate 210, and the patterned photoresist layer can be a patterned positive photoresist mask or a patterned negative photoresist mask. The present disclosure is not limited in this respect.

In FIG. 3, twos of the first trenches T1 are etched to form second trenches T2, such that the first trenches T1 and the second trenches T2 are horizontally and alternately arranged. Moreover, each second trench T2 is between immediately adjacent two of the first trenches T1. The etched twos of the first trenches T1 can be etched by any suitable anisotropic etching process, such as the reactive ion etching process and the plasma etching process, so as to form the second trenches T2. That is, the first trenches T1 and the second trenches T2 collectively define the active areas 213. The present disclosure is not limited in this respect.

In FIG. 4, the first trenches T1 and the second trenches T2 are filled with dielectric material such as silicon dioxide ($SiO_2$) to form the first STI structures 221a and the second STI structures 223a. Thereafter, a chemical-mechanical planarization (CMP) process is performed to the substrate 210, the first STI structures 221a and the second STI structures 223a, so as to remove the unwanted portions thereof. As a result, top surfaces of the first STI structures 221a and the second STI structures 223a are level with a top surface of the substrate 210. Moreover, each second STI structure 223a has a width greater than a width of each first STI structure 221a. The present disclosure is not limited in this respect.

Reference is made to FIGS. 5-9. FIGS. 5-9 can represent forming a conductive line 230 which is across the active areas 213, the first STI structures 221b, and the second STI structures 223c. The conductive line 230 includes work function nodes 231 and the line sections 233 which are horizontally and alternately arranged with work function nodes 231, so as to obtain the cell array 200. Moreover, the work function nodes 231 are respectively formed in the second STI structures 223b, and each work function node 231 is between immediately-adjacent two of the active areas 213. Therefore, the work function nodes 231 can curb the interference among active areas 213, so as to prevent raw hammer effect from negatively affecting the cell array 200.

Figure 5:
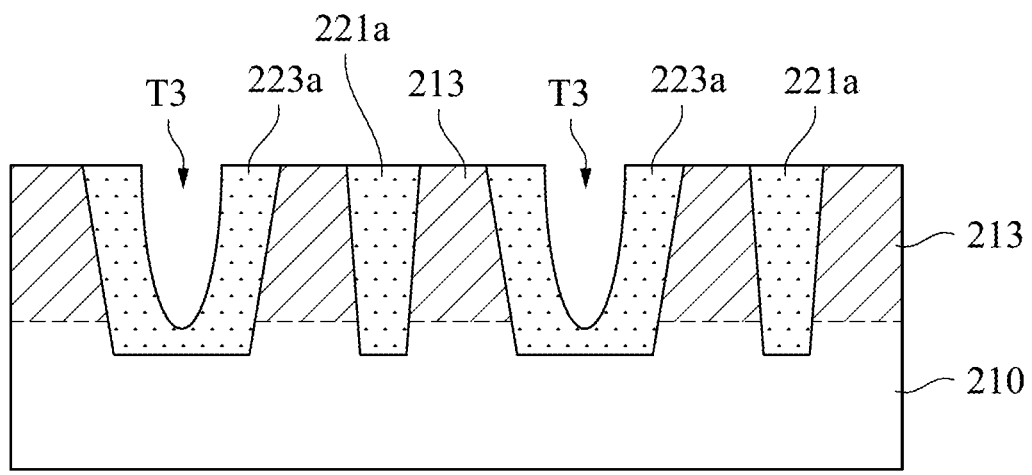
Figure 6:
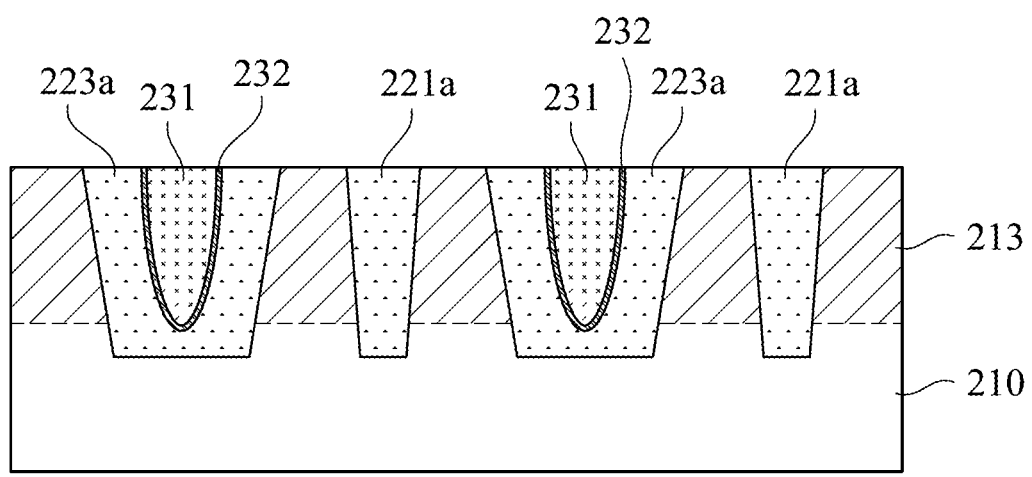

In FIG. 5, third trenches T3 are respectively formed in the second STI structures 223a. The third trenches T3 can be formed by any aforementioned anisotropic etching process, such as the reactive ion etching process and the plasma etching process, but the present disclosure is not limited in this respect. In FIG. 6, the work function nodes 231 are respectively formed in the third trenches T3, and the work function nodes 231 include conductive material, such as titanium nitride (TiN), tantalum nitride (TaN), and any suitable gate material. In some embodiments of the present disclosure, cup-shaped protective films 232 are conformally formed in the third trenches T3, respectively, and then the work function nodes 231 are respectively formed in the protective films 232. Moreover, the work function nodes 231 are cone-shaped. That is, the second STI structures 223a respectively surround the protective films 232, and the protective films 232 respectively surround the work function nodes 231. In some embodiments of the present disclosure, the protective films 232 can include silicon oxynitride (SiON), but the present disclosure is not limited in this respect.

Figure 7:
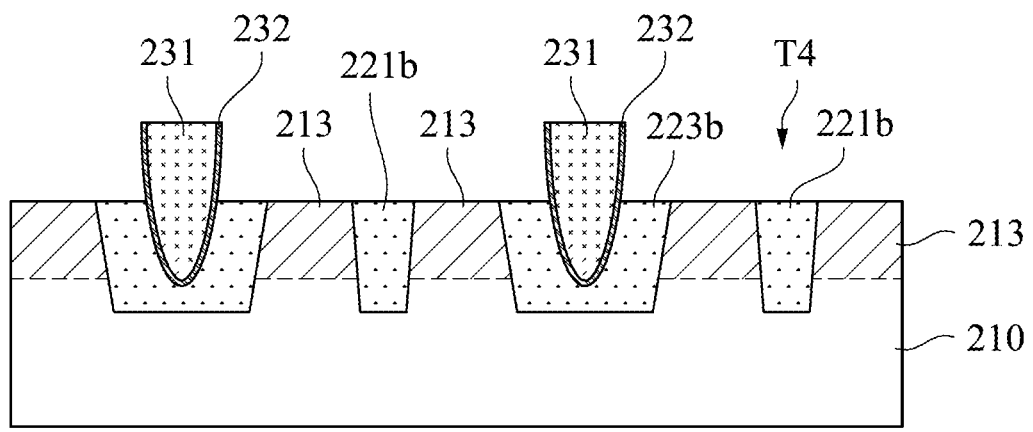

In FIG. 7, a selective etching process is performed to selectively and partially remove the first STI structures 221a, the second STI structures 223a, and the substrate 210, such that forth trenches T4 respectively between twos of the work function nodes 231 are formed. After the selective etching process, the first STI structures 221a and the second STI structures 223a are formed. Specifically, the selective etching process includes performing a wet etching process with solvent containing hydrogen fluoride (HF) and/or ammonium fluoride (NH₄F) to the first STI structures 221a, the second STI structures 223a, and the substrate 210. The protective films 232 can provide great etching selectivity between the work function nodes 231 and any of the substrate 210, the first STI structures 221a, and the second STI structures 223a, so as to form the forth trenches T4. The present disclosure is not limited in this respect.

Figure 8:
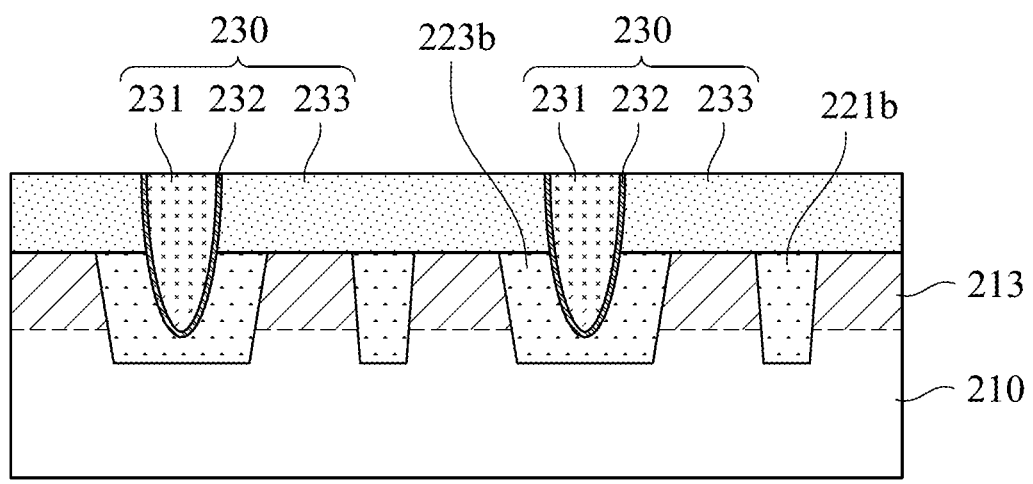

In FIG. 8, the forth trenches T4 are filled with conductive material such as tungsten to form the line sections 233, thereby forming the conductive line 230. In other words, each line section 233 functions as a gate (i.e., buried word line) for controlling current flow in the corresponding active areas 213. Each line section 233 is connected between two of the work function nodes 231, and each work function node 231 has a work function value greater than a work function value of each line section. That is, the work function nodes 231 are made of a material different from a material of the line sections 233. In the present disclosure, work function nodes 231 are defined as conductive nodes which have a higher work function value than a work function value of the line sections 233. In some embodiments, the line sections 233 include tungsten which has a work function value about 4.55 eV, and thus each work function node 231 has a work function value greater than 4.55 eV. The present disclosure is not limited in this respect. In FIG. 8, an insulation layer 251 is formed over the substrate 210 and the conductive line 230, and the insulation layer 251 is made of an insulation material such as silicon nitride (SiN). The present disclosure is not limited in this respect.

Figure 9:
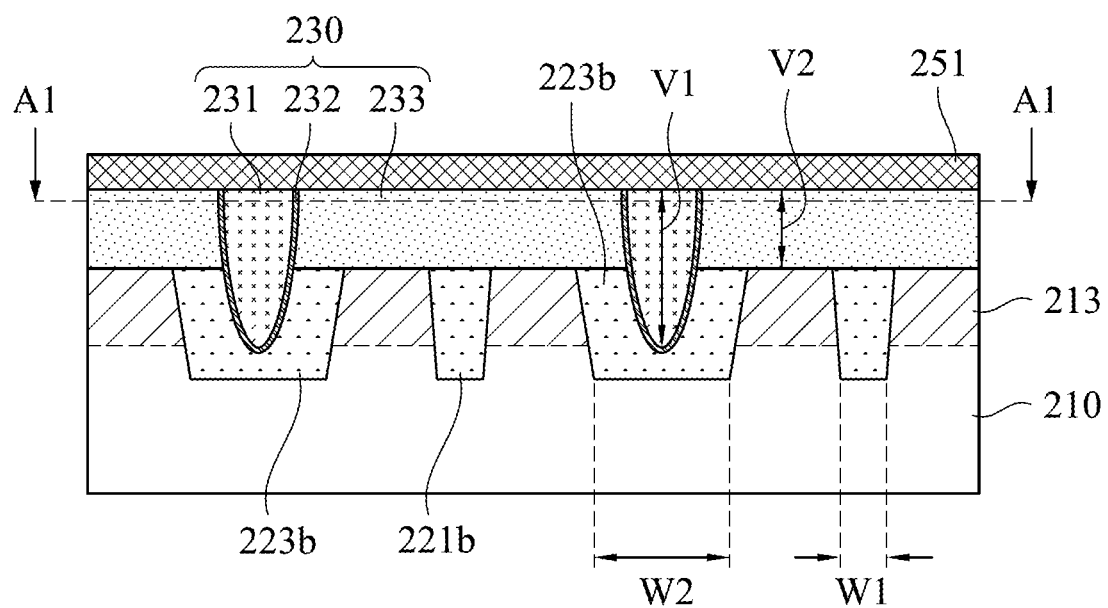
Figure 10:
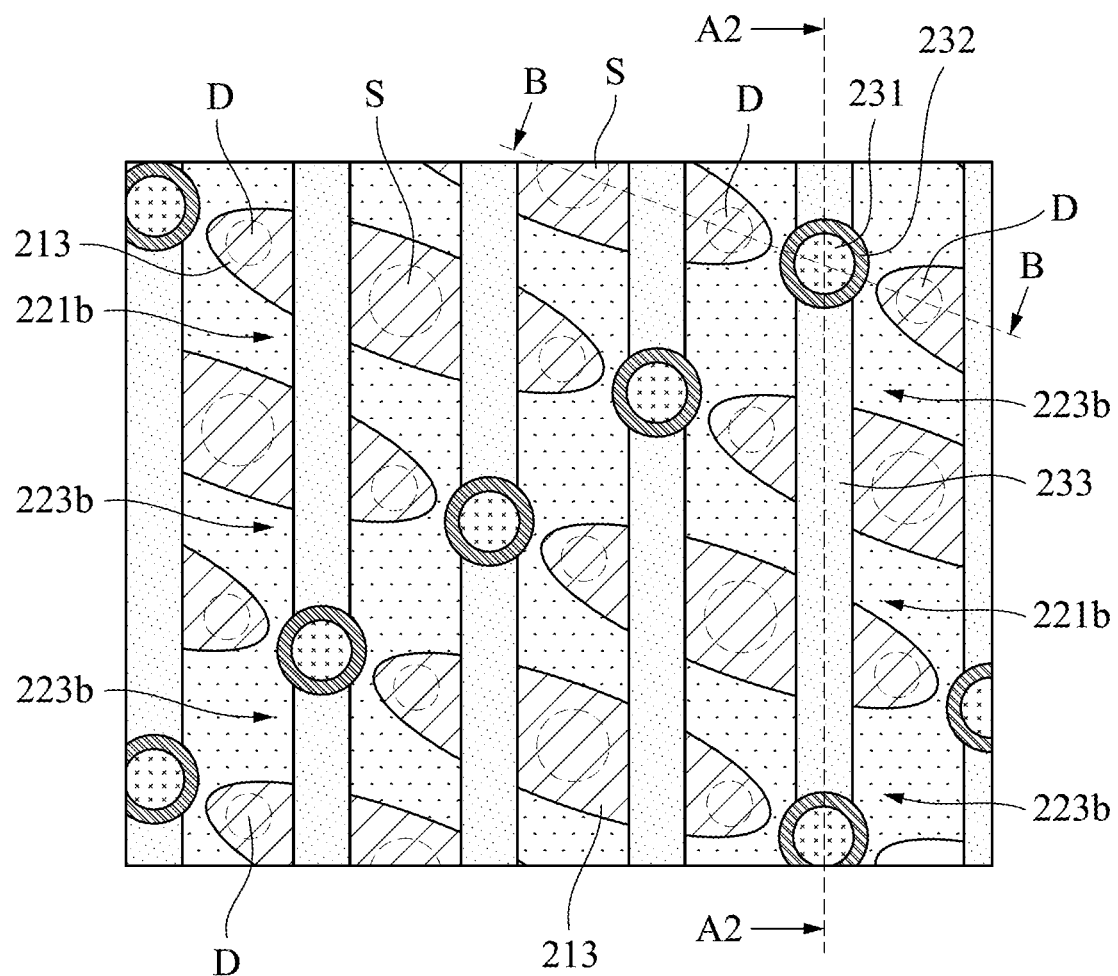
FIG. 10 is a top view of the cell array in accordance with some embodiments of the present disclosure.
Figure 11:
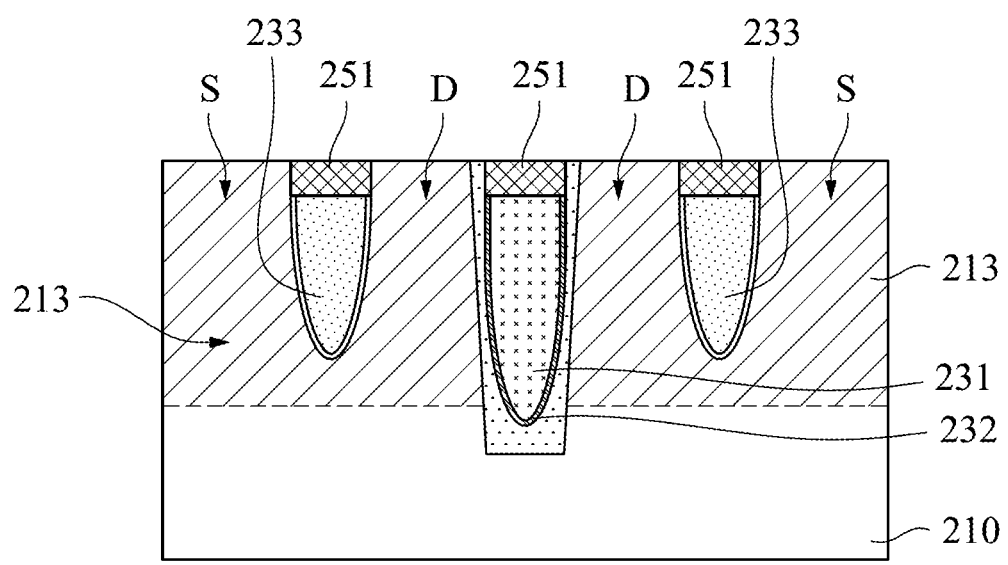
FIG. 11 is a cross-sectional view taken along from the section line B-B in FIG. 10.

Reference is made to FIGS. 8-10. FIG. 8 is a cross section view taken from the cross section line A2-A2 in the FIG. 9. FIG. 9 is a top view of the cell array 200 taken from the line A1-A1, and thus the insulation layer 251 is neglected in FIG. 9. FIG. 10 is another cross section view taken from cross section line B-B in FIG. 9. In some embodiments of the present disclosure, the cell array 200 includes a substrate 210 and a conductive line 230. The substrate 210 has active areas 213 therein, and source regions S and drain regions D are respectively formed in the active areas 213. The conductive line 230 is disposed across the active areas 213, and the conductive line 230 includes work function nodes 231 and line sections 233 which are horizontally and alternately arranged with work function nodes 231, in which each work function node 231 is deposed between immediately adjacent two of the active areas 213. Therefore, the work function nodes 231 can curb the interference among active areas 213, so as to prevent raw hammer effect from negatively affecting the cell array 200. Moreover, the active areas 213 have source regions S and drain regions D, respectively, and the line sections 233 which are across the active areas 213 and respectively located between the source regions S and drain regions D can function as gate, so as to form transistors which can be applied in DRAMs.

In some embodiments of the present disclosure, each work function node 231 has a vertical length V1 greater than a vertical length V2 of each line section 233. As the definition of the work function node 231, each work function node 231 has a work function value greater than a work function value of each line section 233. Moreover, each work function node 231 is between immediately adjacent two of the line sections 233.

In some embodiments of the present disclosure, the conductive line 230 has cup-shaped protective films 232 respectively surround the work function nodes 231, and the work function nodes 231 are cone-shaped. Moreover, work function nodes 231 include titanium nitride (TiN), tantalum nitride (TaN), or any suitable gate material, and the protective films 232 include silicon oxynitride (SiON). The present disclosure is not limited in this respect.

In some embodiments of the present disclosure, the cell array 200 further includes first STI structures 221b and the second STI structures 223b which collectively define the active areas 213, wherein each work function node 231 is partially in one of the second STI structures 223b. Moreover, each second STI structure 223b has a width W2 greater than a width W1 of each first STI structure 221b, and the first STI structures 221b and the second STI structures 223b are made of a dielectric material such as silicon dioxide. The present disclosure is not limited in this respect.

In some embodiments of the present disclosure, the cell array 200 further includes an insulation layer 251 formed over the substrate 210 and the conductive line 230, so as to protect the active areas 213, the work function nodes 231, and line sections 233. The insulation layer 251 includes an insolation material such as silicon nitride, but the present disclosure is not limited in this respect.

Embodiments of the present disclosure provide a cell array and a method for fabricating the same, in which the work function nodes of the cell array can efficiently curb row hammer effect among active areas thereof. Therefore, the data bit failure of a memory device with the provided cell array can be decreased and prevented.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A cell array, comprising:
   a substrate having active areas; and
   a conductive line disposed across the active areas and comprising work function nodes and line sections which are horizontally and alternately arranged with work function nodes, wherein each work function node is between two of the active areas, wherein each work function node has a work function value greater than a work function value of each line section.

2. The cell array of claim 1, wherein each work function node has a vertical length greater than a vertical length of each line section.

3. The cell array of claim 1, wherein each work function node is between immediately adjacent two of the line sections.

4. The cell array of claim 1, wherein the work function nodes are cone-shaped.

5. The cell array of claim 1 further comprising an insulation layer formed over the substrate and the conductive line.

6. The cell array of claim 1, wherein the conductive line has cup-shaped protective films respectively surround the work function nodes.

7. The cell array of claim 6, wherein the cup-shaped protective films comprise silicon oxynitride.

8. The cell array of claim 1 further comprising first STI structures and second STI structures which define the active areas, wherein each work function node is partially in one of the second STI structures.

9. The cell array of claim 8, wherein the first STI structures are alternately arranged with the second STI structures, each second STI structure has a width greater than a width of each first STI structure.

10. A method for forming a cell array, comprising
providing a substrate which has a doped area;
forming first STI structures and second STI structures in the doped area, such that active areas are formed among the first STI structures and the second STI structures; and
forming a conductive line across the active areas, the first STI structures, and the second STI structures, wherein the conductive line comprises work function nodes and line sections which are horizontally and alternately arranged with work function nodes, the work function nodes are respectively disposed in the second STI structures, and each work function node is between two of the active areas.

11. The method of claim 10, wherein each second STI structure has a width greater than a width of each first STI structure.

12. The method of claim 10, wherein forming the STI first structures and the second STI structures in the active areas comprises:
forming first trenches in the substrate; etching twos of the first trenches to form second trenches; and
filling the first trenches and the second trenches with dielectric material to form the first STI structures and the second STI structures.

13. The method of claim 10, forming the conductive line comprises:

forming third trenches respectively in the second STI structures;
forming work function nodes in the third trenches, respectively; and
forming the line sections, wherein each line section is connected between two of the work function nodes.

14. The method of claim 10, forming the conductive line comprises:
forming third trenches respectively in the second STI structures;
comformally forming cup-shaped protective films in the third trenches, respectively;
forming work function nodes in the cup-shaped protective films, respectively; and
forming the line sections, wherein each line section is between two of the work function node.

15. The method of claim 10, forming the conductive line comprises:
selectively and partially remove the first STI structures, the second STI structures, and the substrate, such that fourth trenches respectively between twos of the work function nodes are formed; and
filling the fourth trenches with conductive material to form the line sections.

16. The method of claim 10, further comprising forming an insulation layer on the substrate and the conductive line.

17. The method of claim 10, wherein the work function nodes are cone-shaped.

18. The method of claim 10, wherein each work function node has a vertical length greater than a vertical length of each line section.

19. The method of claim 10, wherein each work function node has a work function value greater than a work function value of each line section.

* * * * *